United States Patent [19]
Tepman et al.

[11] Patent Number: 5,589,224
[45] Date of Patent: Dec. 31, 1996

[54] APPARATUS FOR FULL WAFER DEPOSITION

[75] Inventors: Avi Tepman, Cupertino, Calif.; Takeshi Jinbo, Ichihara, Japan; Hiroyuki Takahama, Sawara, Japan; Akihiko Saito, Chiba, Japan

[73] Assignee: Applied Materials, Inc., Santa Clara, Calif.

[21] Appl. No.: 310,617

[22] Filed: Sep. 22, 1994

Related U.S. Application Data

[63] Continuation-in-part of Ser. No. 954,850, Sep. 30, 1992.

[30] Foreign Application Priority Data

Sep. 30, 1993 [JP] Japan ..................... 5-245469

[51] Int. Cl.$^6$ ..................... C23C 16/00
[52] U.S. Cl. .................. 427/248.1; 118/715; 118/719; 118/725; 118/728
[58] Field of Search .................. 118/715, 719, 118/725, 728; 427/248.1

[56] References Cited

U.S. PATENT DOCUMENTS

| | | | |
|---|---|---|---|
| 5,065,698 | 11/1991 | Koike | 118/719 |
| 5,094,885 | 3/1992 | Selbrede | 118/725 |
| 5,135,629 | 8/1992 | Sawada | 118/715 |
| 5,169,684 | 12/1992 | Takagi | 118/725 |
| 5,192,371 | 3/1993 | Shuto | 118/728 |
| 5,213,650 | 5/1993 | Wang | 118/728 |
| 5,228,501 | 7/1993 | Tepman | 118/728 |
| 5,238,499 | 8/1993 | van de Ven | 118/728 |

FOREIGN PATENT DOCUMENTS

| | | | |
|---|---|---|---|
| 60-96755 | 5/1985 | Japan . | |
| 63-246814 | 10/1988 | Japan . | |
| 63-238263 | 10/1988 | Japan . | |
| 2141575 | 5/1990 | Japan | 118/715 |

Primary Examiner—Richard Bueker
Attorney, Agent, or Firm—Donald J. Verplancken; B. Todd Patterson

[57] ABSTRACT

The present invention provides a shield arrangement that prevents deposition in the area of the chamber surrounding the substrate. This shield arrangement is equipped with a wall-like member which surrounds a substrate, and includes a projecting annular flange and a substrate support which extends in the horizontal direction beyond the substrate, and includes a groove therein. The annular flange is received in the groove to shield the deposition region of the chamber from the remainder of the chamber.

13 Claims, 4 Drawing Sheets

1

APPARATUS FOR FULL WAFER DEPOSITION

RELATED APPLICATIONS

This is a continuation-in-part of co-pending U.S. application Ser. No. 08/954,850, filed Sep. 30, 1992.

BACKGROUND OF THE INVENTION

1. Field of the Invention

This invention relates generally to deposition shields for processing chambers, including, for example, physical vapor deposition or sputtering chambers, chemical vapor deposition chambers and ion implantation chambers. In addition, the invention relates, for example, to chambers used for the formation of integrated circuits or integrated circuit components on substrates such as semiconductor wafers.

2. Background of the Art

In deposition processes, species from a source such as a target, a gas inlet manifold, etc., may deposit on exposed internal chamber surfaces, including the chamber walls and hardware. Shields are available which are designed to intercept such species and prevent deposition thereof on the chamber walls and hardware. However, to our knowledge, the available shields have not been successful in completely blocking unwanted deposition on these surfaces. Also, such shields may be difficult and/or time-consuming to replace, and they require relatively frequent replacement. The use of automatic substrate exchange systems, with their attendant in-chamber movable components, increases the difficulty of attaining adequate shielding and easy replacement of these shields.

SUMMARY OF THE INVENTION

In one aspect of the invention, the shield arrangement includes a circumferential shield member extending inwardly of the chamber and surrounding the deposition environment containing region of the chamber, and a substrate support member positionable at a retracted position to receive a substrate thereon and an extended position to position the substrate for processing in the chamber. Additionally, the support member includes a recess or groove therein, into which the inner terminus of the shield extends to provide a continuous shielded connection between the shield and the support member. The shield and the support member combine to shield the non-deposition regions of the chamber from the deposition environment. Preferably, the shield and the support member do not touch, and therefor minimal particle generation occurs by the interaction of these two elements in the chamber.

A spacing means may be used to form a space between the substrate edge and the substrate support, to prevent the formation of a bridging film layer between the substrate and the substrate support. Additionally, the recess in the support member may be extended inwardly of the support and thereby extend under the edge of a substrate received on the support member. Furthermore, the support member may include a positioning means which positions the substrate on the support member and prevents movement of the substrate with respect to the support member during processing.

Useful materials for the shield system include stainless steel, aluminum, titanium and copper.

The shield arrangement is effective and easily removed for cleaning and/or replacement.

BRIEF DESCRIPTION OF THE DRAWINGS

The above and other aspects, features and advantages of the invention are described below with respect to the drawings, in which.

DESCRIPTION OF THE EMBODIMENTS

Figure 1:
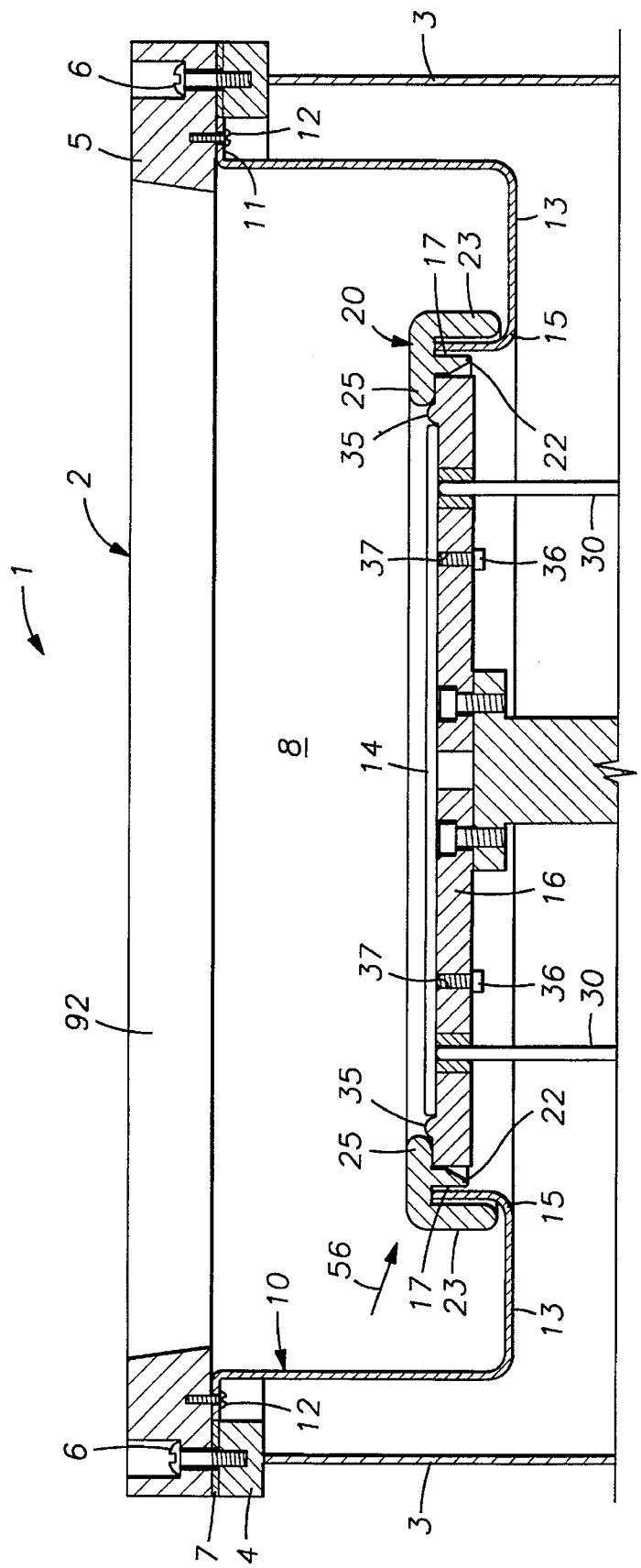
FIG. 1 is a schematic simplified partial vertical section view of a shielded processing chamber which embodies our present invention.

FIG. 1 is a simplified schematic drawing which illustrates an embodiment of the invention incorporated in a deposition chamber. The invention effectively shields the chamber surfaces and internal hardware from deposition, yet affords easy removal of the shield components for cleaning or replacement. The invention also permits full wafer deposition, that is, deposition over the entire surface of a substrate 14 such as a semiconductor wafer. The invention is applicable to deposition chambers generally, including for example physical vapor deposition or sputtering chambers, chemical vapor deposition chambers, and ion implant chambers.

By way of example, FIG. 1 illustrates a sputtering chamber 2. The substrate 14 is positioned adjacent to the chamber processing region 8 on a support member 16 such as a susceptor or a pedestal. By way of example, the diameter of the support member 16 is greater than that of the substrate 14. In the exemplary arrangement, the substrate support member 16 may be attached, as by a plurality of screws 9—9, FIG. 2, to a conventional vertically movable elevator system 18. (Please note, hardware such as gas inlet manifolds and/or sputtering targets is omitted for clarity.)

The exemplary sputter chamber 2 includes a cylindrical chamber wall 3 and a support ring 4 which is mounted to the top of the chamber wall, as by welding. An adaptor plate 5 which may form the top wall of the chamber 2 is attached to the support ring 4 by a plurality of screws 6—6. O-ring 7 provides an hermetic seal. A deposition source (not shown) such as a sputtering target assembly or a gas inlet manifold may be mounted in recess 35 and sealed from the ambient conditions on the exterior of the chamber. A wall-like cylindrical shield member 10 is mounted to the support ring 4. That is, the cylindrical shield 10 has an outwardly extending upper lip 11 which is attached to the bottom of the adaptor plate 5 by a plurality of screws 12—12. A flange 15 extending upwardly from annular bottom wall 13 of the shield member 10 surrounds the periphery of the substrate support member 16, leaving a space 17 between the shield flange 15 and the support 16.

The deposition shield 1 also includes an annular shield ring 20 having an inner diameter which is selected so that the ring fits peripherally over the support 16 adjacent to the substrate 14. The ring 20 includes a downward extending, tapered centering flange 22 which fits into the opening 17 between the shield flange 15 and the side edge of the substrate support 16, and a second, outer flange 23 which is generally parallel to flange 22. The shield ring 20 is mounted in removable fashion at the periphery of the substrate 14 by seating the two flanges over the mating flange 15 of the cylindrical shield means 10, with the tapered centering flange 22 extending into the opening 17. The shield ring 20 also comprises a raised, inwardly-extending roof 25 which protects the periphery of the substrate from species traveling inwardly, for example, along direction 56, and prevents deposition on the surfaces on which the shield ring 20 rests and on the associated ring-surface interfaces.

As mentioned, the shield arrangement uniquely combines full effective shielding of the chamber with easy removal. Specifically, effective shielding action is provided by the cylindrical shield member 10, the relatively wide substrate support member 16 (that is, the portion of the support which extends laterally beyond the substrate) and the shield ring 20, which overlaps both the substrate support 16 and the inwardly-extending bottom section of the shield member 10. These overlapping components combine to isolate the processing region of the chamber 8 from the rest of the chamber interior and shield the rest of the chamber (for example, chamber walls 3 and the internal chamber hardware such as the movable elevator 18 beneath the support member 16) from deposition materials. The shield components are easily removed, by removing the adaptor plate mounting means such as the screws 6—6 and lifting out as a unit the adaptor plate 5; the shield member 10, which is attached to the adaptor plate 5; and the shield ring 20, which is supported in removable fashion on the shield member 10. The dual-function substrate support member and shield component 16 is then easily removed by removing the three mounting screws 9—9, FIG. 2. Alternatively, the shield ring 20 can be removed by simply lifting the ring out of the locating space 17, or the shield ring 20 can be removed to permit removal of the substrate support member 16, if desired, without removing the shield 10. Obviously, the shield components are replaced for example by attaching the substrate support member 16 using screws 9—9, and inserting the shield unit and attaching the unit to the chamber via screws 6—6.

Figure 4:
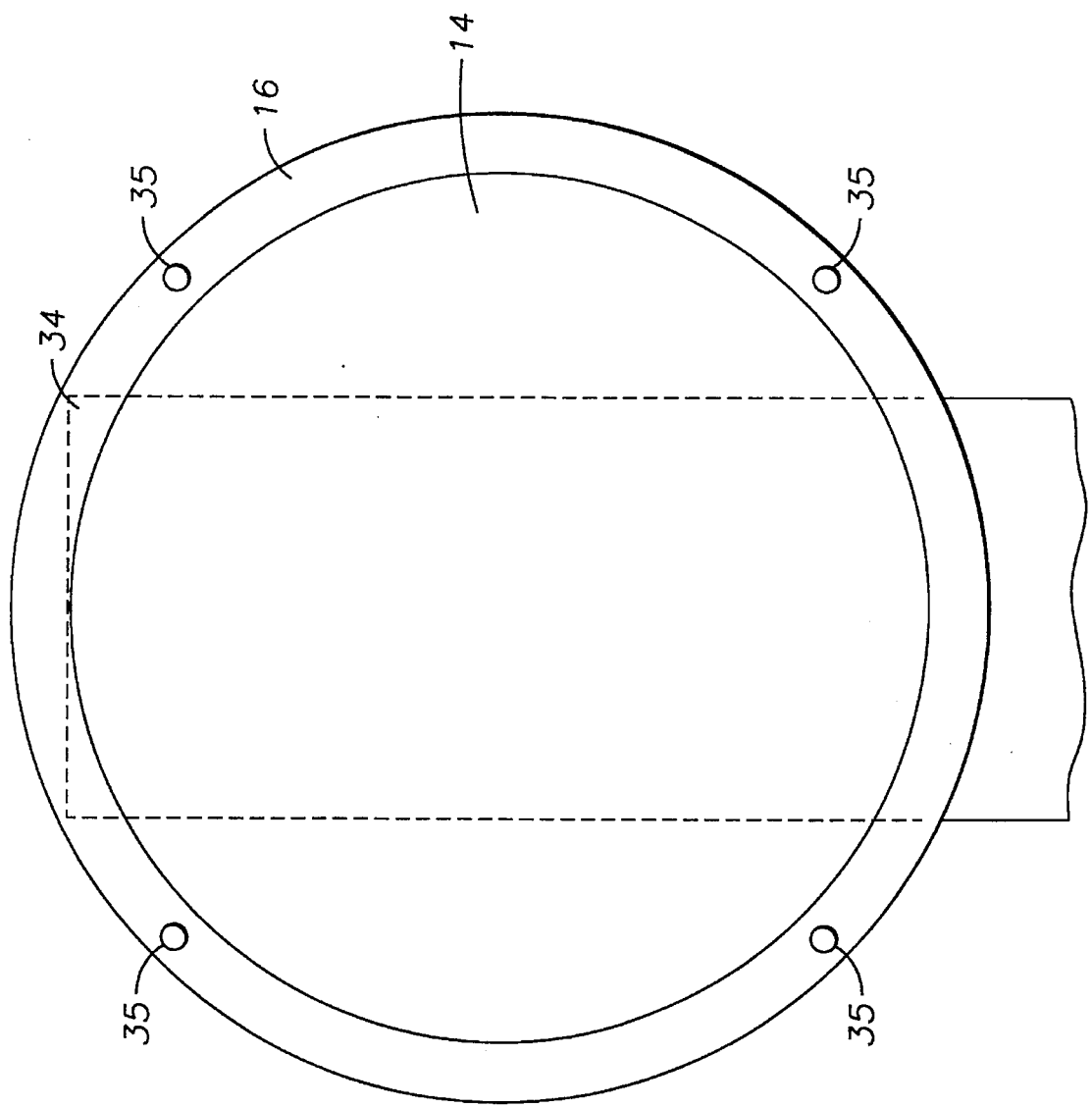
FIG. 4 is a simplified schematic representation of the relationship of the substrate, the substrate support member, the substrate centering or locating means, and a robot transfer blade.

In accordance with another aspect of our invention, substrate locating or centering means such as protrusions or bumps 35—35 (see FIG. 4 as well as FIG. 1) are formed in the upper surface of the substrate support member 16 peripheral to the mounting position of the substrate 14 for precisely centering the substrate on the support. As shown in FIG. 4, four alignment bumps 35—35 are positioned at 90° intervals in a rectangular array, to effect the positioning function 360° about the periphery of the substrate 14. The locating means limits lateral movement of the substrate 14 relative to the substrate support member 16 and thus ensures the substrate is positioned at the desired location on the substrate support member 16 for processing and ensures that the substrate 14 is in position on the support member 16 for processing by the robot blade 34. The locating function permits full wafer deposition, that is, deposition over the entire surface of a substrate 14 such as a wafer, without using edge clamps, or where clamps are not required. Preferably, the alignment bumps 35—35 are rounded (for example, hemispherical) to avoid sharp corners which can cause particles to flake off into the processing environment. The alignment bumps 35—35 also provide a physical stop at the perimeter of the substrate, to prevent substantial movement of the substrate 14 on the substrate support member 16 during deposition.

Referring to FIGS. 1, 2, 4 and 5, in the illustrated chamber system the substrate support 16 is mounted to the elevator 18 for vertical movement relative to an arrangement of pins 30—30 which themselves are moved vertically by a second vertical lift or elevator mechanism 32. The coordinated vertical movement of the substrate support 16 and the substrate support pins 30—30 (which extend through holes 33—33 in the substrate support) in combination with the coordinated horizontal movement of a substrate transfer blade 34, FIG. 4, transfers substrates into and out of the chamber and onto and off the substrate support 16. In addition, vertical movement of the substrate support member 16 by elevator 18 permits precise positioning of the substrate relative to the source such as a gas inlet manifold and/or a sputtering target. This type of automatic substrate exchange and positioning system is known in the art and is described for example in commonly assigned U.S. Pat. No. 4,951,601 issued Aug. 28, 1990 to inventors Maydan, et al.

Despite the complications provided by the above-described moving parts, the deposition shield system 1 provides effective shielding against unwanted deposition and is readily removable and replaceable. Please note, although the illustrated cylindrical shield system 1 is configured for a circular semiconductor substrate, other shield configurations may be used as required to conform to other substrate and chamber configurations.

In accordance with another aspect of my invention, a spacer means, in the form of a plurality of pins 36—36 threaded through mating holes 37—37 in the substrate support member 16, supports the substrate 14 just above the upper surface of that member. The spacer means provides a small gap 50 (Best shown in FIG. 3) between the support member 16 and the substrate 14, and this gap 50 prevents material which deposits along the exposed periphery of the support member at the edge of the substrate 14 from bonding to the substrate 14 and thereby bonding the support member 16 to the substrate 14. The spacer(s) thus facilitate full wafer deposition. The height of the pins 36—36 preferably provides a gap of about 0.5–1 millimeter between the substrate 14 and its support 16. A gap 50 greater than about 1 millimeter may allow the deposited material to reach the backside of the substrate.

Figure 3:
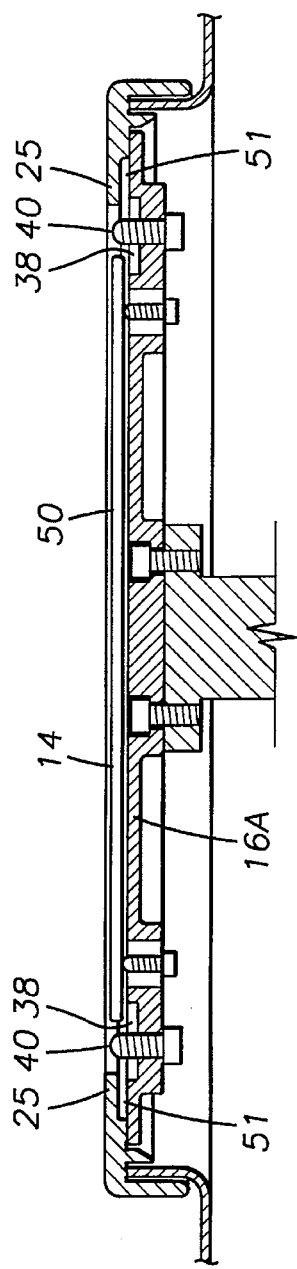
FIG. 3 illustrates an alternative embodiment of the shield arrangement depicted in FIG. 1.

FIG. 3 depicts an alternative shielded substrate support 16A which is preferred for high rate deposition, typically of relatively low stress material such as aluminum and aluminum-containing compounds and materials. Please note, typical processes may deposit about 1000 Angstroms of material per substrate, with the result that perhaps 5000 substrates can be processed before the support or pedestal 16 must be cleaned. Aluminum thickness, however, may be 10,000 Angstroms per substrate. Because of the possible backside deposition, the gap 50 cannot be increased sufficiently to accommodate this increased deposit thickness. Instead, a channel or groove 38 is provided in the substrate support 16A along the periphery of the substrate 14. The groove 38 allows additional build-up of deposited material (relative to a planar configuration) on the support 16 along the edge of the substrate 14 without the material sticking to the substrate and without interfering with the positioning and orientation of the substrate 14 on the substrate support member 16. In the FIG. 3 embodiment, the centering means is located in the groove and, thus, comprises elongated threaded centering pins 40—40 of adjustable length which are attached to the substrate support 16A via threaded holes, instead of the smaller (shorter) centering bumps or protrusions 35—35 as shown in FIG. 1. Also, the gap 51 between the roof 25 and the surface of the substrate support member 16 beneath the roof 25 prevents the roof 25 from sticking to the substrate support member 16A. In addition, the radial length of the inward extending roof 25 prevents deposited material from reaching the surfaces upon which the roof 25 is supported.

Useful material for the components of the shield system 1 includes a stainless steel, aluminum, titanium, and copper. Stainless steel is a preferred material because it is relatively easy to clean. Aluminum or copper may be preferred when depositing materials such as tungsten which will not stick to stainless steel.

FIG. 4 is a simplified schematic drawing, not to scale, depicting the relationship of the substrate 14, the locating or centering means (35 or 40), the substrate support member 16 and the robot transfer blade 34. In the illustrated embodiment, the locating means comprises four bumps 35—35 spaced at 90° intervals around the near-periphery of the substrate support member 16 for effecting secure positioning 360° around the substrate.

Although operation of the robot blade of the type contemplated here is well known, one mode of operation will be reviewed to ensure understanding of the cooperation among the various components. To position a substrate 14 on the support 16, the substrate is positioned on the robot blade 34 and the blade 34 is inserted into the chamber, typically through a slit valve-controlled opening or other suitable opening (now shown) in the chamber wall, to position the substrate over the retracted (lowered) support 16 and pin array 30—30. The pins 30—30 are raised by elevator 32 relative to the substrate support member 16 to lift the substrate 14 off the robot blade 34. The robot blade is withdrawn and the elevator 32 and pins 30—30 are lowered relative to the substrate support member 16, thereby depositing the substrate onto the spacer support pins 36—36, with the substrate being centered by the locating means 35—35. In the illustrated embodiment, elevator 18 can be used to vary the vertical position of the support 16 and the substrate 14 relative to the processing region or the sputtering source or the gas inlet manifold, etc., to control the fabrication process.

Conversely, to remove the substrate 14 from the chamber after processing, the pins 30—30 are elevated through the holes 33—33 relative to the substrate support member 16, then the robot blade 34 is inserted between the substrate support member and the substrate to lift the substrate 14 off the spacer support pins 36—36. Elevator 32 is actuated to lower the elevator pins 30—30, to deposit the substrate 14 on the robot blade 34 and the robot blade and the substrate 14 are withdrawn from the chamber.

Figure 5:
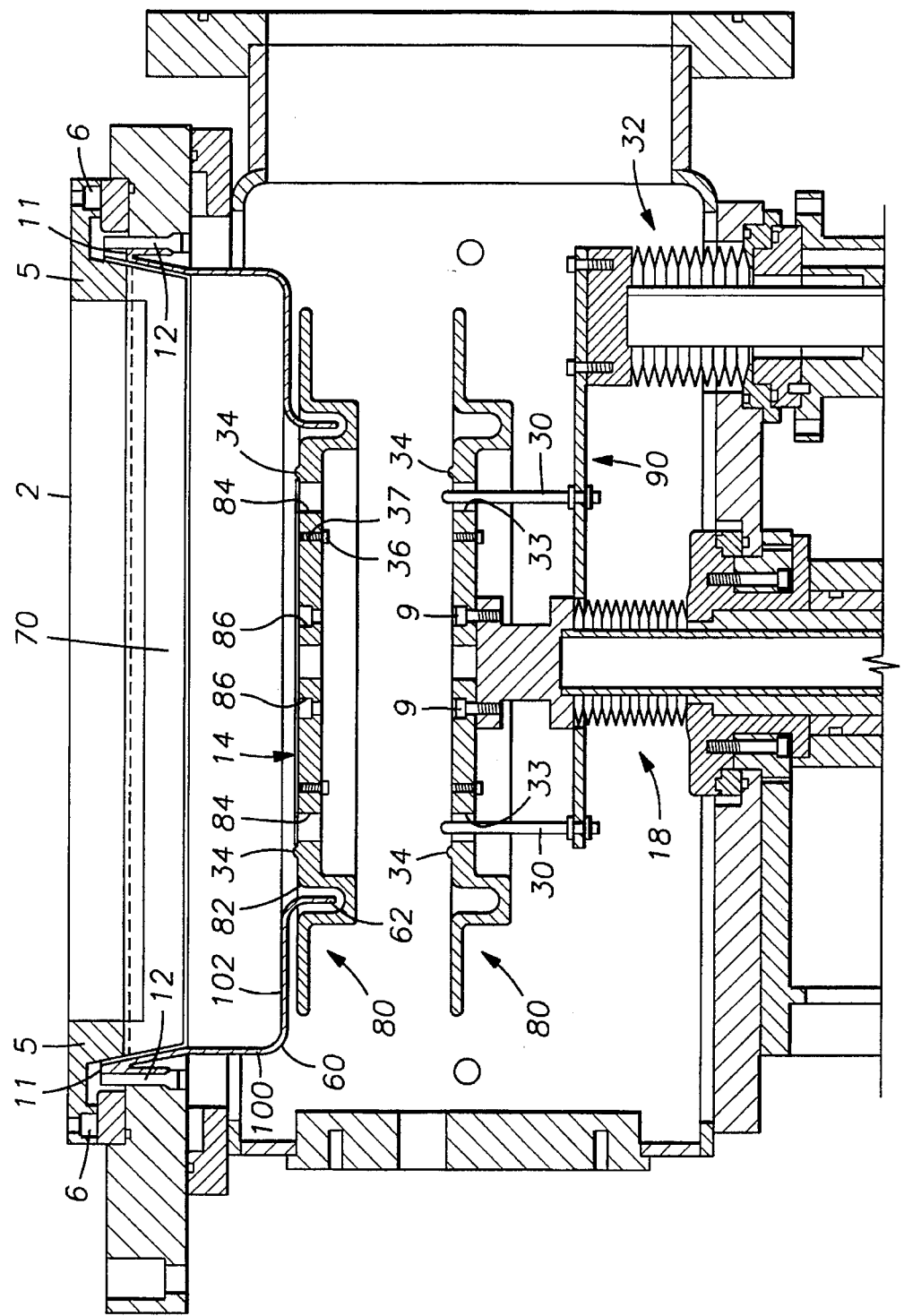
FIG. 5 is an elevation view showing the relationship of the substrate, substrate holding member, substrate centering and positioning devices, and robot carrier blade in a preferred embodiment of this invention.

Referring now to FIG. 5, a further embodiment of the shield arrangement 1 for a sputter deposition chamber is shown. The chamber 2 generally includes a shield 60, a target 70, a pedestal 80, and a lifter 90 apparatus. The shield 60 generally extends circumferentially about the inner circumference of the chamber 1, and is supported in the chamber 2 by a support flange 11 connected to the cover 12 of the chamber 2. The shield 60 includes a first cylindrical portion 100 spaced from the adjacent portions of the chamber, an inwardly extending ledge portion 102 extending from the inward terminus of the first cylindrical portion 100 and a downwardly extending flange 62 extending from the ledge portion 102. The pedestal 80 includes a circumferential groove 82 formed in the substrate receiving portion thereof, into which the flange 62 is selectively received. The groove is preferably U-shaped, that is, it includes a base and an inner and an outer wall. Thus, deposition materials cannot pass through the pedestal 80 at the groove 82. The diameter of the circumferential groove 82 is large enough for the lifting pins 30 to extend through the pedestal 80 within the diameter of the groove 80, and to allow a substrate 14, when received on the pedestal 80, to be located within the circumference of the groove 82. Preferably, the groove 82 is sized with respect to the flange 62 so that the flange 62 and the pedestal 82 does not make contact. By extending the shield 60 into the groove 62, and thus inwardly of the pedestal 80, while preventing contact between the shield 60 and the pedestal 80, the deposition material sputtered from the target 70 is completely shielded from the sides and base of the chamber 2 and from the interior components of the chamber 2, such as the lifting apparatus 90, but particle generating contact between the shield 60 and the pedestal 80 is avoided.

The portions of the chamber 2 providing the shielding, i.e., the shield 60 and the pedestal 80, are configured to be easily removed from the chamber 2 and replaced with clean replacements. The pedestal 80 includes a plurality of counterbored holes 86 therethrough, through which screws 9 are extended to attach the pedestal 80 to the elevator 18. Additionally, a plurality of holes 84 extend through the pedestal 80 within the circumference of the groove 82, through which the lifting pins 30 selectively extend.

The shield 60 and pedestal 80 combine to shield the interior region of the chamber 2, which in the embodiment of the chamber 2 shown in FIG. 5, includes the portions of the chamber 2 below, and radially outwardly of, the shield 60 and the pedestal 80. Thus, the regions of the chamber in which the slit valve and the pin lifter 90 are located are shielded from the deposition environment maintained between the pedestal 80 and the chamber cover.

To operate the chamber 2 of FIG. 5, a substrate 14 is supplied to the chamber 2 by a robot (not shown). The back side of the substrate 14 supplied by the robot is lifted off the robot by moving the lifter 90 to move the pins 30 inwardly of the pedestal 80 and lift the substrate 14 off the blade with the pins 30. The robot moves then moves from the chamber 2 while the substrate 14 is maintained in a stationary position above the pedestal 80. The pedestal 80 then ascends to lift the substrate 14 off the pins 30 and to position the pedestal 80 such that the lower flange 62 of the shield 60 is received in the groove 82 of the pedestal 80. The target 70 is then sputtered, to provide material to form a deposition layer on the substrate 14.

Figure 2:
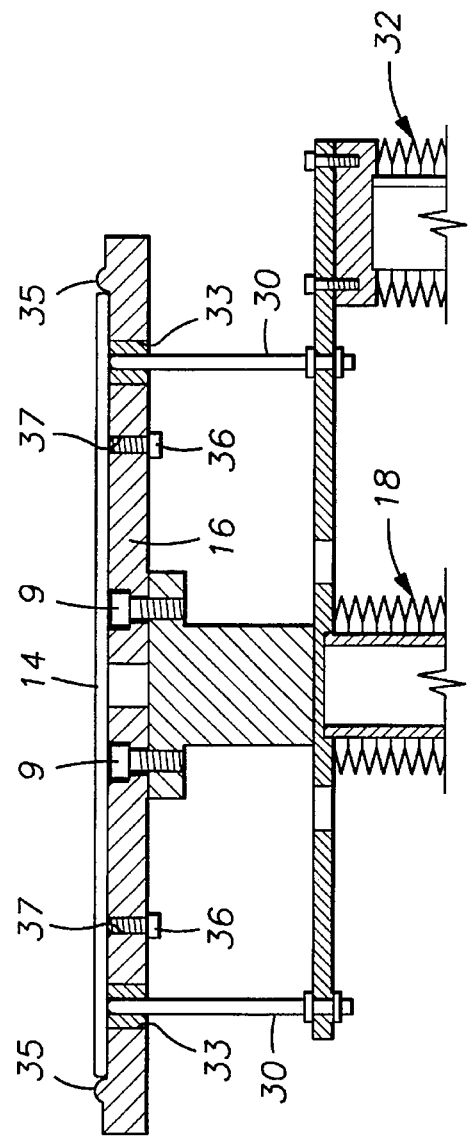
FIG. 2 is a schematic simplified partial vertical sectional view of an automatic substrate exchange system.

Although the pedestal 80 is shown in FIG. 5 as including the bumps 34 for substrate alignment and the substrate 14 may be received directly on the pedestal 80, the invention also specifically contemplates the use of spacers such as the spacers 36 shown in FIG. 2, to provide a gap between the underside of the substrate 14 and the upper, substrate receiving surface of the pedestal 80. Additionally, a secondary groove could be provided adjacent the edge of the substrate 14, or the groove 82 could extend inwardly of the pedestal 80 to a position below the edge of the substrate 14, to ensure that the deposition layer formed on the substrate 14 within the chamber 2 does not form a bridging film layer between the substrate 14 and the pedestal 80.

By isolating the shield 60 from the pedestal 80, and isolating the edge of the substrate 14 from the surface of the pedestal 80, the incidence of particle generating contact between the substrate 14, the pedestal 80 and the shield 60 is substantially eliminated. Additionally, the shielding components of the chamber, i.e., the pedestal 80 and the shield 60, are easily replaced without affecting the lifting mechanism. The shield 60 may be removed from the chamber of simply removing the chamber cover to which it is attached, and the pedestal 80 may be removed from the chamber by removing the bolts 9 connecting the pedestal 80 to the elevator 18. These components may then be replaced with clean components, to allow deposition to continue in the chamber. Furthermore, the gap between the flange 62 and the groove 82 permits a substantial quantity of deposition material to be deposited on the surface of the pedestal 80 and flange 62, before bridging contact of the deposit on the flange 62 and the pedestal 80 can occur. This enables a longer period between shield replacement and enables that movement of the pedestal 80 to locate the flange 62 in the groove 82 will not cause particles of the material deposited thereon to become free in the chamber.

We claim:

1. A deposition shield arrangement for limiting the deposition of deposition materials on internal chamber components during the processing of a substrate in the deposition chamber, comprising:

a substrate support member disposed in the chamber and selectively positionable in the chamber to receive a substrate thereon;

a shield member extending circumferentially around the substrate support member and cooperating with said substrate support member to prevent deposition on the deposition chamber interior surfaces shielded by said shield member and said substrate support member during the processing of a substrate in the chamber;

said support member including a circumferential groove extending inwardly of the substrate receiving portion thereof; and said shield member including a circumferential, downwardly extending portion received in said groove when said support member is positioned for the processing of a substrate in the chamber.

2. The shield arrangement of claim 1, wherein the chamber includes a cover, and said shield member extends from said cover and inwardly of the chamber.

3. The shield arrangement of claim 2, wherein said shield member is a one-piece member.

4. The shield arrangement of claim 3, wherein said shield member is stationary; and said support member may be moved between a retracted position for receipt of a substrate thereon, and an extended position whereby said extending portion of said shield is received in said groove.

5. The shield arrangement of claim 1, wherein said groove circumscribes the substrate receiving region of the support member.

6. The shield arrangement of claim 1, wherein said groove extends inwardly of the substrate receiving region of said support member.

7. The shield arrangement of claim 1, further including a spacer means for spacing a substrate received on said support member from said surface of support member during the deposition of deposition materials on the substrate.

8. The arrangement of claim 1, further including a secondary groove provided in said support member and positioned to be located under the edge of a substrate received on the support member.

9. The shield arrangement of claim 1, further including a space between the terminus of said circumferential, downwardly extending portion and said groove when said support member is positioned for the processing of a substrate in the chamber.

10. A method of shielding the interior surfaces of a processing chamber from a deposition environment maintained within the chamber, comprising the steps of;

providing a moveable substrate support member, having a substrate receiving surface and an extending portion extending outwardly from said substrate receiving surface, in the chamber;

providing a shield member extending inwardly of the chamber and spaced from the chamber walls said support member and said shield cooperating to shield portions of the chamber from the deposition environment maintained in the chamber;

providing a groove in the extending portion of the support member; and extending a portion of the shield member into the groove.

11. The method of claim 10, wherein said groove and said shield do not contact.

12. The method of claim 10, wherein said groove extends partially under a substrate when the substrate is received on the support member.

13. The method of claim 10, wherein said substrate is supported from the support member on a plurality of pins.

* * * * *

UNITED STATES PATENT AND TRADEMARK OFFICE
CERTIFICATE OF CORRECTION

PATENT NO. : 5,589,224
DATED : December 31, 1996
INVENTOR(S) : Tepman et al.

It is certified that error appears in the above-identified patent and that said Letters Patent is hereby corrected as shown below:

On the title page, item [63], please replace " 07/954,850" with " 07/954,860".

On column 1, line 7, please replace " 07/954,850" with " 07/954,860".

Signed and Sealed this

Twelfth Day of December, 2000

Attest:

Q. TODD DICKINSON

*Attesting Officer*     *Director of Patents and Trademarks*